United States Patent
Nishimaki et al.

(10) Patent No.: US 7,899,239 B2
(45) Date of Patent: Mar. 1, 2011

(54) INSPECTION METHOD OF BONDED STATUS OF BALL IN WIRE BONDING

(75) Inventors: Kimiji Nishimaki, Tokyo (JP); Noritaka Horiuchi, Tokyo (JP)

(73) Assignee: Kaijo Corporation, Tokyo (JP)

(*) Notice: Subject to any disclaimer, the term of this patent is extended or adjusted under 35 U.S.C. 154(b) by 1281 days.

(21) Appl. No.: 11/237,032

(22) Filed: Sep. 28, 2005

(65) Prior Publication Data

US 2006/0079008 A1    Apr. 13, 2006

(30) Foreign Application Priority Data

Sep. 30, 2004    (JP) .................................. 2004-287697

(51) Int. Cl.
G06K 9/00    (2006.01)
B23K 31/12    (2006.01)
H01L 21/00    (2006.01)

(52) U.S. Cl. .......... 382/145; 382/149; 228/103; 228/105

(58) Field of Classification Search .................. 382/141, 382/145; 348/86, 125; 228/105, 103, 110.1
See application file for complete search history.

(56) References Cited

U.S. PATENT DOCUMENTS

| | | | | |
|---|---|---|---|---|
| 5,394,246 A * | 2/1995 | Sugawara | ...................... | 356/394 |
| 5,905,595 A * | 5/1999 | Minami | ........................ | 359/618 |
| 5,991,040 A * | 11/1999 | Doemens et al. | ............. | 356/614 |
| 6,059,846 A * | 5/2000 | Arai et al. | ..................... | 29/25.01 |
| 6,556,291 B2 * | 4/2003 | Yonezawa | .................. | 356/237.2 |
| 6,787,378 B2 * | 9/2004 | Ishii et al. | ........................ | 438/14 |
| 7,191,929 B2 * | 3/2007 | Nishimaki et al. | ............ | 228/105 |
| 7,224,446 B2 * | 5/2007 | Kreh et al. | .................. | 356/237.4 |
| 7,388,979 B2 * | 6/2008 | Sakai et al. | ................... | 382/149 |

FOREIGN PATENT DOCUMENTS

| | | |
|---|---|---|
| JP | 6-224267 | 8/1994 |
| JP | 06-224267 | * 12/1994 |
| JP | 7-37955 | 2/1995 |
| JP | 10-311713 | 11/1998 |

* cited by examiner

Primary Examiner — Vu Le
Assistant Examiner — Andrae S Allison

(57) ABSTRACT

An inspection method of determining the bonded status of a wire ball bonded to a pad of a semiconductor chip is provided. An image of the bonding position between the pad and the ball is taken by an image-taking unit for detection of an in focus height of the pad, in focus height of an upper surface of the bonded ball, an external diameter of the bonded ball, and a ball bonded point respectively while switching a color of a coaxial illuminating light depending on the specific position for the inspection. Blue light can be used in the detection of the pad and an external diameter of the bonded ball while red or yellow light is used for detecting an upper surface of the bonded ball and the ball bonded point.

16 Claims, 7 Drawing Sheets

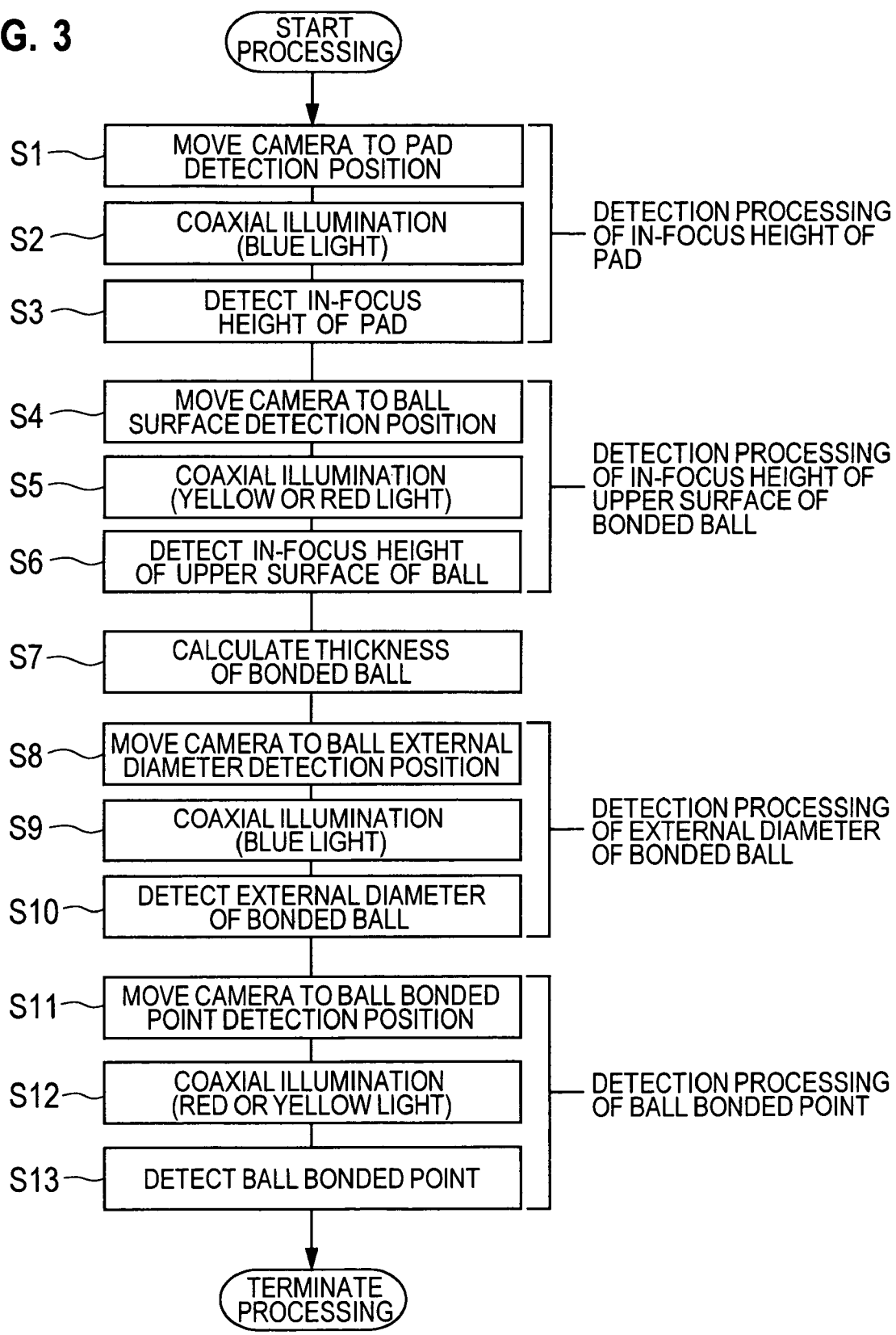

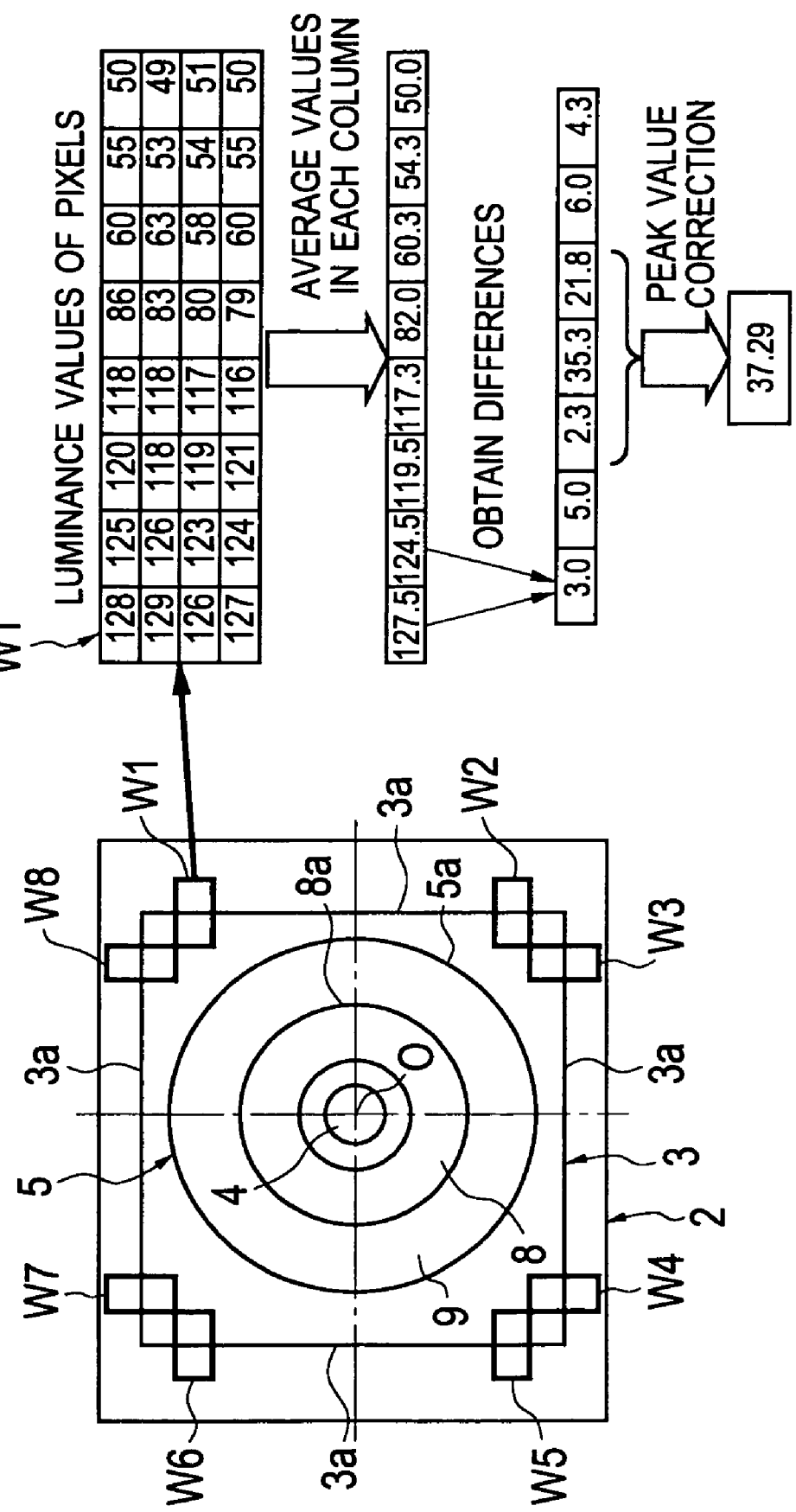

INSPECTION METHOD OF BONDED STATUS OF BALL IN WIRE BONDING

BACKGROUND OF THE INVENTION

1. Field of the Invention

The present invention relates to a method for inspecting a bonded status of a ball bonded to a pad of a semiconductor chip by image processing in wire bonding which attains wiring between the pad of the semiconductor chip and an external electrode.

2. Description of the Related Art

Referring first to FIGS. 2A and 2B, a bonded condition between a pad of a semiconductor chip and a ball in wire bonding will be described.

In FIGS. 2A and 2B, reference numeral 1 denotes a lead frame; 2 denotes a semiconductor chip mounted on the lead frame 1; 3 denotes a pad formed on the semiconductor chip 2 (a first bonding point); 4 denotes a bonding wire such as a gold wire; and 5 denotes a ball formed at the tip of the bonding wire 4 and bonded to the pad 3.

The ball 5 formed at the tip of the bonding wire 4 has an almost spherical shape before bonding and the ball 5 is pressedly bonded onto the pad 3 by applying a supersonic vibration to the ball 5 while pressing it with a capillary 6 at the time of wire bonding, as shown in FIG. 2A.

At the center of the top surface of the ball 5 bonded to the pad 3, a cone portion 8 with a conical shape is formed by an inside chamfer portion 7 recessed into the inside of the tip of the capillary 6, and an almost flat upper surface 9 is formed around the cone portion 8 of the ball 5.

Conventionally, when quality of bonding is checked by detecting a thickness t, an external diameter D, a bonded point (center position) O of the ball 5 bonded to the pad 3 and the like, each dimension is measured based on vertical and/or horizontal displacements which are obtained by the use of a metallographic microscope and the like which can measure vertical and horizontal displacements by an operator manually focusing the microscope on target locations. However, In the case of such a manual measuring method, it is difficult to obtain a sufficient measurement accuracy because variations are generated depending on the operator who judges whether the microscope is accurately focused on the target locations.

In order to solve such a problem, a method is proposed to measure the thickness t of the bonded ball 5, wherein a plane image of the cone portion 8 of the ball 5 captured through a lens of a camera is compared and checked with a reference pattern image of the cone portion which is set in advance and an image taking height position at which the images are best matched is regarded as an in-focus height (Japanese Patent Application Laid-Open Publication No. 6-224267).

However, in the case of conventional inspection methods for the bonding portion between the pad and ball utilizing image processing including Japanese Patent Application Laid-Open Publication No. 6-224267, the bonding portion between the pad and ball to be inspected is only illuminated by a single type of illumination light such as white light, so that it may be difficult to obtain a clear image with high contrast depending on measurement conditions.

In another inspection method proposed in Japanese Patent Application Laid-Open Publication No. 10-311713, an image of a bonding wire portion connecting between the pad and a lead (external electrode) is taken by a color camera and the obtained color image is converted into each of hue (H), saturation (S) and intensity (I) data, whereby the quality of the wire portion is determined by the use of the HSI data. In an inspection method proposed in Japanese Patent Application Laid-Open Publication No. 7-37955, quality of a wire is determined by obtaining each of RGB images of a wire portion while illuminating the wire portion with ring illumination or laser slit light of red (R) light, green (G) light and blue (B) light and by performing digitalization of each of the obtained RGB images.

However, both of the inspection methods disclosed in Japanese Patent Application Laid-Open Publication Nos. 10-311713 and 7-37955 are intended to inspect the quality of the wire connecting the pad and the lead and cannot be directly applied to the inspection of the bonding portion between the pad and ball to which the present invention is directed.

SUMMARY OF THE INVENTION

The present invention has been made in view of the foregoing disadvantages of the prior art. Accordingly, it is an object of the present invention to provide an inspection method for a bonded status of a bonded ball in wire bonding, which method can accurately detect the bonded status of the ball by the use of image processing, wherein coaxial light parallel to an optical axis of a lens of an image taking means is utilized as illumination light illuminating a bonding portion between a pad and the ball and the color of the coaxial light is switched to optimum color depending on a location of the pad and ball to be inspected.

In accordance with the present invention, there is provided an inspection method of a bonded status of a ball bonded to a pad of a semiconductor chip in wire bonding which attains wiring between the pad of the semiconductor chip and an external electrode, wherein an image of a bonding portion between the pad and the ball is taken by an image taking means and a plane image taken by the image taking means is image processed to detect the bonded status of the ball. The method comprises: utilizing coaxial light parallel to an optical axis of a lens of the image taking means as illumination light illuminating the bonding portion between the pad and the ball; and switching the color of the coaxial light depending on details of the inspection.

In a preferred embodiment of the present invention, the details of the inspection of the bonded status include at least detections of an in-focus height of the pad, an in-focus height of an upper surface of the bonded ball, an external diameter of the bonded ball and a ball bonded point; wherein the color of the coaxial illumination light is blue at the time of processing the detection of the in-focus height of the pad; wherein the color of the coaxial illumination light is yellow or red at the time of processing the detection of the in-focus height of the upper surface of the bonded ball; wherein the color of the coaxial illumination light is blue at the time of processing the detection of the external diameter of the bonded ball; and wherein the color of the coaxial illumination light is red or yellow at the time of processing the detection of the ball bonded point.

In a preferred embodiment of the present invention, the processing of the detection of the in-focus height of the pad includes: taking a plane image of the bonding portion between the pad and the ball illuminated by the blue coaxial illumination light at each step position while vertically moving the image taking means at predetermined step intervals; obtaining luminance differences in an edge portion of the pad on each taken image; and determining the in-focus height of the pad based on an image taking height position at which the taken image has the maximum luminance difference.

In a preferred embodiment of the present invention, the processing of the detection of the in-focus height of the upper surface of the bonded ball includes: taking a plane image of the bonding portion between the pad and the ball illuminated by the yellow or red coaxial illumination light at each step position while vertically moving the image taking means at predetermined step intervals; obtaining luminance differences in the upper surface of the bonded ball on each taken image; and determining the in-focus height of the upper surface of the bonded ball based on an image taking height position at which the taken image has the maximum luminance difference.

In a preferred embodiment of the present invention, the processing of the detection of the external diameter of the bonded ball includes: taking a plane image of the bonding portion between the pad and the ball illuminated by the blue coaxial illumination light with the image taking means; obtaining luminance differences in an outer peripheral edge portion of the ball on the taken image; and determining the external diameter of the ball based on a distance between positions of pixels of the taken image which are located on the diametrically opposite sides and which have the maximum luminance differences on the respective sides.

In a preferred embodiment of the present invention, the processing of the detection of the ball bonded point includes: taking a plane image of the bonding portion between the pad and the ball illuminated by the red or yellow coaxial illumination light with the image taking means; obtaining luminance differences in an outer peripheral edge portion of a cone portion formed on the top of the ball on the taken image; and determining the ball bonded point based on a middle point between positions of pixels of the taken image which are located on the diametrically opposite sides and which have the maximum luminance differences on the respective sides.

In a preferred embodiment of the present invention, ring illumination light is used as auxiliary light in addition to the coaxial illumination light.

According to the present invention, the color of coaxial illumination is switched to an optimum color depending on the details of the inspection of the bonded status of the ball, so that an accurate detection can be performed in accordance with a respective one of the details of the inspection, and a conventional problem of false detection due to insufficient contrast can be prevented from being generated whenever possible.

Especially, the advantage can be positively achieved by making the color of the coaxial illumination light blue at the time of detection processing of an in-focus height of the pad, by making the color of the coaxial illumination light yellow or red at the time of detection processing of an in-focus height of an upper surface of the bonded ball, by making the color of the coaxial illumination light blue at the time of detection processing of an external diameter of the ball and by making the color of the coaxial illumination light yellow or red at the time of detection of a ball bonded point.

In addition, by using the ring illumination light as auxiliary light, contrast of a taken image can be finely tuned, so that the inspection can be achieved more accurately.

BRIEF DESCRIPTION OF THE DRAWINGS

The above and other objects, aspects, features and advantages of the present invention will become more apparent from the following detailed description when taken in conjunction with the accompanying drawings, in which:

FIG. 3 is a flowchart showing an example of a process flow according to the method of the present invention;

FIG. 4 is an explanatory view showing a principle of measuring an in-focus height of the pad;

DETAILED DESCRIPTION OF THE INVENTION

An embodiment of the present invention will now be described with reference to the drawings.

Figure 1:
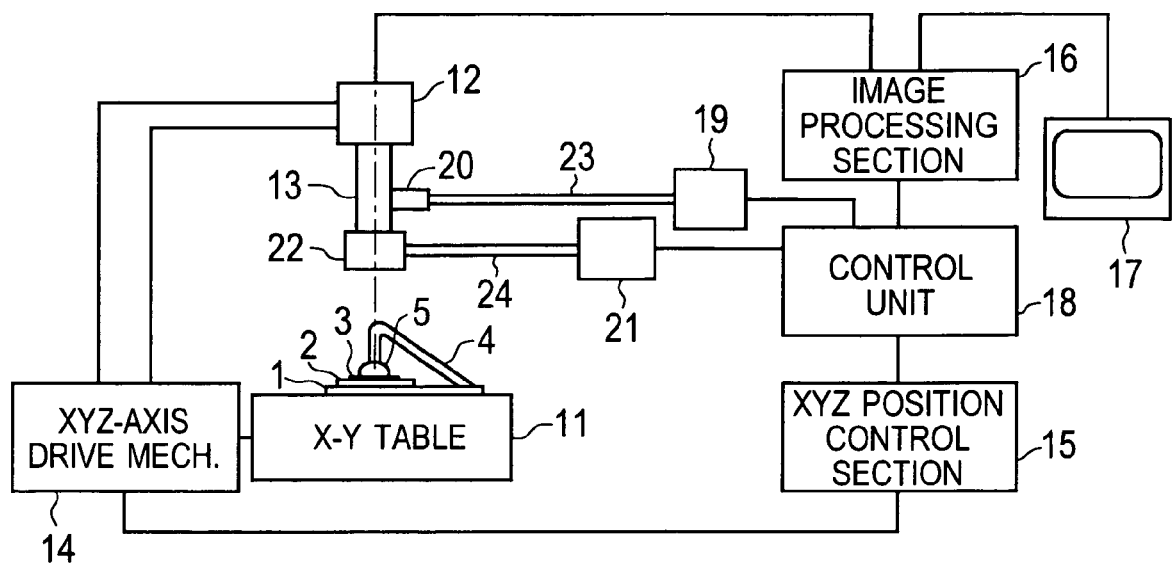
FIG. 1 is a block diagram showing an example of an inspection apparatus for a bonded ball in wire bonding, configured so as to carry out the method of the present invention.

FIG. 1 is a block diagram showing an embodiment of a wire-bonding inspection apparatus configured so as to carry out the method of the present invention.

In FIG. 1, reference numeral 11 denotes an X-Y table movable in a horizontal plane; 12 denotes a monochrome camera movable in a Z-axis direction or a vertical direction for taking an image of a bonding portion between a pad 3 of a semiconductor chip 2 and a ball 5 from above (hereinafter, simply referred to as "the camera"); 13 denotes a lens of the camera 12; 14 denotes an XYZ-axis drive mechanism for moving the X-Y table 11 and the camera 12 to desired positions; 15 denotes an XYZ position control section for controlling the movement of the X-Y table 11 and camera 12 by the XYZ-axis drive mechanism 14; 16 denotes an image processing section for detecting an external diameter D, a thickness t and a bonded point O of the ball 5, in which an luminance image taken by the camera 12 is captured and image processed; 17 denotes a monitor for displaying the taken images and processed data; 18 denotes a control unit for controlling processing operations of the entire apparatus; 19 denotes a coaxial-illumination RGB light source; 20 denotes a coaxial illumination means; 21 denotes a ring-illumination RGB light source; and 22 denotes a ring illumination means.

The coaxial-illumination RGB light source 19 and ring-illumination RGB light source 21 are each constituted by light-emitting diodes respectively emitting lights of three primary colors, i.e. red (R), green (G) and blue (B) and a lighting control circuit thereof so as to generate illumination light of any color by controlling activation of each of the RGB light-emitting diodes, which illumination light is supplied via optical fibers 23 and 24 to the coaxial illumination means 20 and ring illumination means 22, respectively.

The coaxial illumination means 20 is constituted by, for example, a half mirror disposed at a 45-degree slant within a barrel of the lens 13 so as to irradiate the ball 5 and pad 3 with the illumination light transmitted via the optical fiber 23 from the coaxial-illumination RGB light source 19 as coaxial light parallel to an optical axis of the lens 13.

The ring illumination means 22 are constructed by, for example, disposing fiber tips of a multiplicity of fibers constituting the optical fiber 24 around the barrel of the lens 13 in a ring shape so as to irradiate the ball 5 and pad 3 from directions around the entire circumference of the lens 13 with the illumination light transmitted from the ring-illumination RGB light source 21.

Figure 2A:
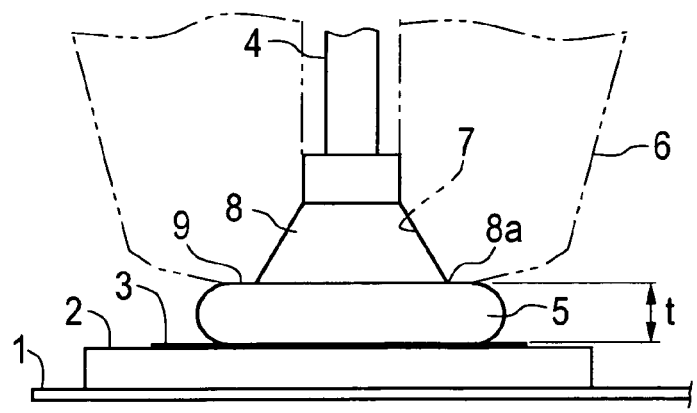
FIGS. 2A and 2B are elevational and plan views illustrating a bonded condition of a pad and a ball in wire bonding.
Figure 2B:
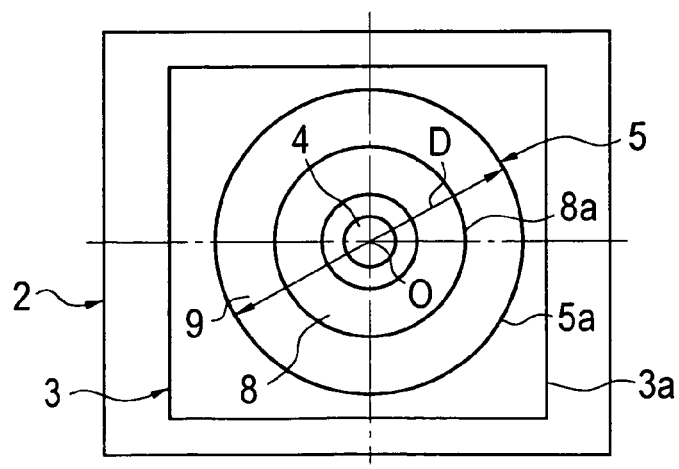

A lead frame 1 equipped with the semiconductor chip 2 is mounted on the X-Y table 11, and the ball 5 formed at a tip of a bonding wire 4 is pressedly bonded onto the pad 3 of the semiconductor 2 by a capillary 6 (see FIG. 2A).

In the inspection method of the present invention, coaxial illumination is adopted to obtain a clear image of a horizontal upper surface of the ball 5 necessary for the ball detection. As described above, since the coaxial illumination light is a light beam cast in parallel with the optical axis of the lens 13 of the camera 12, the light is reflected vertically upward when the coaxial illumination light is cast vertically from above upon the pad 3 or the horizontal upper surface of the ball 5, with the result that the rate of the light returned to the camera 12 increases and luminance is heightened. On the other hand, when the coaxial illumination light is cast upon a slanted surface of a cone portion 8 or a circular-arc curved surface of an outer peripheral edge of the ball 5, the coaxial illumination light is reflected obliquely outwardly in accordance with a law of reflection, with the result that the rate of the light returned to the camera 12 decreases and luminance is lowered. Therefore, when the coaxial illumination light is used, a high contrast image necessary for the ball detection can be obtained from the horizontal upper surface of the ball 5.

On the other hand, since the ring illumination light is light beams cast obliquely from the optical fibers and the like disposed around the barrel of the lens 13 in a ring shape upon the pad 3 and ball 5, the light reflected from the horizontal surfaces of the pad 3 and ball 5 and reaching the camera 12 may be reduced, whereas the light reflected from the slanted surface of the cone portion 8 or the circular-arc curved surface of the outer peripheral edge of the ball 5 and reaching the camera 12 may be increased. Therefore, in the case of the ring illumination light, the image is likely to be different from an image that it is originally desired to obtain for image processing. Accordingly, in the present invention, the coaxial illumination with which a clear image necessary for the ball detection can be obtained for the horizontal surface of the ball 5 is utilized, and the ring illumination is used as auxiliary light for adjusting contrast in the case where the inspection has problems when only the coaxial light is used for detection of the external diameter of the ball or the like. Therefore, the ring illumination may not be a RGB light source.

Referring to a flowchart shown in FIG. 3, a specific processing example according to the method of the present invention using the wire-bonding inspection apparatus as constructed above will be described hereinafter.

(1) Detection Processing of In-Focus Height of Pad (Steps S1 to S3 in FIG. 3)

First, detection of an in-focus height of the pad 3, i.e., detection of the position of the horizontal upper surface of the pad 3 in a Z-axis direction or vertical direction will be described with reference to a taken image shown in FIG. 4.

When the processing is started, under the control of the control unit 18, the XYZ position control section 15 drives and controls the XYZ-axis drive mechanism 14 to move the camera 12 to a maximum-height position (or a minimum-height position) of a measurement range of the in-focus height of the pad 3 which is set in advance (steps S1 of FIG. 3).

At the same time, the control unit 18 drives and controls the light-emitting diodes in the coaxial-illumination RGB light source 19 to generate blue (B) light and transmit the blue light to the coaxial illumination means 20 via the optical fiber 23, to thereby illuminate a bonding portion between the ball 5 and pad 3 with the blue coaxial light (step S2 of FIG. 3). In obtaining the in-focus height of the pad 3, the blue light is used as the illumination light for the following reason.

From experiences based on past experiments and researches as well as manufacturing of actual equipments, the inventors have attained the knowledge that red light or yellow light may be used when it is desirable to create images of fine irregularities on a surface and that blue light may be used when it is not desirable to create an image of fine irregularities on a surface. In the case of obtaining the in-focus height of the pad 3, an image of fine irregularities on the surface of the pad 3 is not needed, and it is advantageous that the luminance of the pad 3 has fewer variations. Therefore, blue light is selected as the illumination light.

The in-focus height of the pad 3 is obtained by detecting an edge 3a of the pad 3 in the taken image shown in FIG. 4. In this instance, if an internal pattern or the like of the semiconductor chip 2 exists in the vicinity of the edge 3a of the pad 3, the luminance level of the internal pattern is increased in the case of using red light or yellow light as the illumination light, so that the detection of the edge 3a of the pad 3 may be adversely affected since contrast is not established between the pad 3 and the internal pattern. Therefore, one reason for adopting the blue illumination light is to constrain the luminance level of such an internal pattern.

The camera 12 obtains a plane image of the bonding portion between the pad 3 and the ball 5 illuminated by the blue coaxial light and transmits it to the image processing section 16 as a luminance image shown in FIG. 4. The image processing section 16 executes image processing described below, based on the luminance image taken with the blue coaxial light, to detect the in-focus height of the pad 3, i.e., the position of the surface of the pad 3 in the Z-axis direction or vertical direction (step S3 of FIG. 3).

First, the image processing section 16 captures the taken image shown in FIG. 4 and thus transmitted thereto and detects a length and a width of the pad 3 in the taken image by image processing, to thereby determine whether the length and width of the pad are each within a reference size range or not.

If the length or width of the pad 3 is not within the reference size range, it is determined that a normal measurement cannot be performed, and the camera 12 is moved by a predetermined increment or step distance (e.g. 1 μm) to a next height position, wherein the above operations are repeated.

On the other hand, if the length and width are each within the reference size range, it is determined that a normal measurement can be performed, and a luminance level in the vicinity of an edge 3a of the pad 3 in the taken image. The calculation of the luminance level in the vicinity of the edge 3a of the pad 3 is performed in a manner shown in FIG. 4.

More specifically, the edge 3a of the pad 3 is detected in the taken image, and luminance detection areas or windows W1 to W8 with a predetermined size are respectively set at, for example, eight (8) locations near the corners of the pad 3 so that each of the windows crosses the edge 3a of the pad 3.

In the case of the example shown in FIG. 4, the size of the luminance detection windows W1 to W8 is set so that each luminance detection window is constituted by an array of pixels in four rows and eight columns, which window has a four-pixel width in a direction parallel to the edge 3a of the pad 3 and an eight-pixel width in a direction orthogonal to the edge 3a (a total of 32 pixels), as illustrated as the luminance detection window W1 in the top-right section of FIG. 4.

After setting the eight (8) luminance detection windows W1 to W8, for each luminance detection window W1 to W8, luminance values of the pixels are added and averaged in each column or in the direction parallel to the edge 3a to obtain average luminance values; then differences between the adjacent average luminance values are obtained; and a maximum difference luminance value having a maximum value is selected from the obtained differences.

Then, the eight (8) maximum difference luminance values obtained from the luminance detection windows W1 to W8 are added, so that the added value is defined as a luminance level of the pad 3 in the taken image. In a case of only one (1) luminance detection window being set, the maximum difference luminance value in the luminance detection window may be defined as the luminance level of the pad 3 in the taken image.

To facilitate understanding, the luminance detection window W1 of FIG. 4 will be specifically described.

For the luminance detection window W1 constituted by the array of pixels in four rows and eight columns (a total of 32 pixels), when assuming that luminance values of respective pixels have the values shown in a table in the top-right section of FIG. 4, first, the luminance values of the pixels in each column are added in the direction parallel to the edge 3a of the pad 3, and then the average value is obtained for each column as shown in a second table illustrated in FIG. 4.

Subsequently, for the eight (8) obtained average luminance values, differences are calculated between the adjacent average luminance values. From the difference luminance values obtained in this way, a difference luminance value having a maximum value (35.3 in FIG. 4) is defined as the maximum difference luminance value of the luminance detection window W1.

In an actual measurement, the edge 3a may lie or run on the middle of the pixel rather than just through the boundary between the adjacent pixels. In this case, the luminance value of the pixel overlapping with the edge 3a may be smaller than the real value, and the resultant difference value may be smaller than the real value.

Therefore, although the maximum difference luminance value of 35.3 may be adopted as the maximum difference luminance value of the luminance detection window W1 without modification, it is preferable that a peak value correction be performed by a quadratic function approximation using the difference luminance values of 2.3 and 21.8 on both sides thereof, and the corrected peak value be adopted as the maximum difference luminance value of the luminance detection window. For reference, a value of 37.29 is shown in FIG. 4 as a value after the peak value correction by the quadratic function approximation using the difference luminance values of 2.3 and 21.8 on both sides of 35.3.

When the maximum difference luminance value is obtained for each of the eight (8) luminance detection windows W1 to W8 in the described manner, the eight (8) obtained maximum difference luminance values are added, and the added value is defined as the luminance level of the pad 3 in the taken image.

After the luminance level is obtained for the pad 3 in the taken image, the camera 12 is moved to a next position at the predetermined step intervals (for example, intervals of 1 μm) to take a next image and the operation for measurement of the luminance level of the pad 3 in each taken image is repeated.

When the measurement of the luminance level of the pad 3 in the taken image is completed for the entire predetermined measurement range while the camera 12 is moved at the predetermined step intervals, a taken image with the largest calculated luminance level of the pad 3 is selected from all the taken images, and the image taking height position of the selected taken image is defined as an in-focus height of the pad 3 at which the camera 2 best focuses on the pad 3.

Since respective taken images are successively taken at the predetermined step intervals (for example, intervals of 1 μm), the exact in-focus height of the pad 3 may exist in an intermediate position between the steps, at which intermediate position an image is not taken actually by the camera 12. In addition, measurement errors are included in the luminance level of the pad 3 calculated as described above in each taken image.

Therefore, although the image taken height position at which the taken image has the highest luminance level of the pad 3 may be adopted as the in-focus height without modification, it is preferable that a quadratic function approximation of the in-focus height be performed using the luminance level data of the pad 3 in each taken image, and a peak position on the obtained approximated curve be adopted as an accurate in-focus height of the pad 3.

Figure 5:
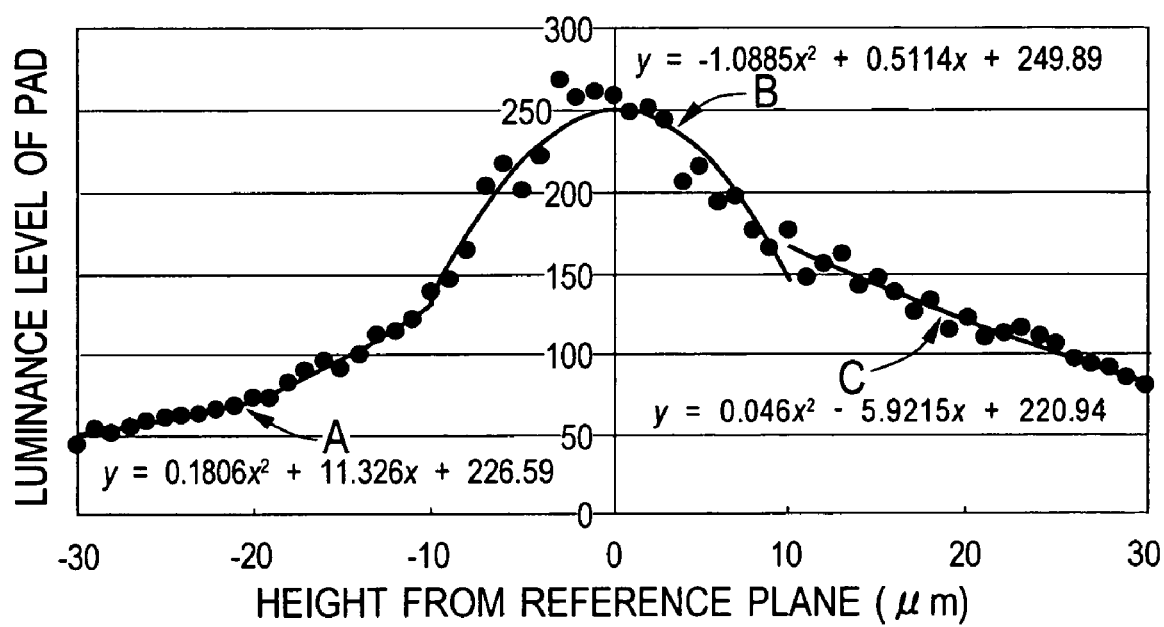
FIG. 5 is a diagram showing an example of a method for determining the in-focus height of the pad by a quadratic curve approximation.

FIG. 5 shows an example of calculation of the peak position by the quadratic function approximation.

FIG. 5 represents luminance level data of the pad 3 plotted for 61 taken images successively taken at step intervals of 1 μm over a height range of +/−30 μm in the upward and downward directions from a reference plane.

As shown in FIG. 5, since the calculated luminance level data of the pad 3 have irregularities due to measurement errors and the like, it is understood that the maximum luminance level position of the pad 3 is difficult to simply adopt as the in-focus height of the pad 3. Therefore, it is more rational to perform a quadratic function approximation using data of consecutive n points from the measured luminance data and determine the real in-focus height of the pad 3 based on the peak position on the obtained approximated curve.

For example, in FIG. 5, when the quadratic function approximation is performed using data of n=21 points in a range from −30 to −10 μm, an approximated curve A is obtained; when the quadratic function approximation is performed using data of n=21 points in a range from −10 to +10 μm, an approximated curve B is obtained; and when the quadratic function approximation is performed using data of n=21 points in a range from +10 to +30 μm, an approximated curve C is obtained, as respectively shown in FIG. 5.

It is apparent from the three (3) approximated curves A, B and C that the result of the quadratic function approximation may considerably vary depending on the data used and that the in-focus height can be accurately approximated by performing the quadratic function approximation with the luminance level data within a range expected to include the peak point, i.e., the luminance level data within a range from −10 to +10 μm.

Therefore, in the present invention, in order to achieve the optimum quadratic function approximation, a quadratic approximated curve, $y=ax^2+bx+c$ (where x represents a height from the reference plane and y represents a luminance level of the pad) is obtained for each data range while sequentially shifting a data range used for the quadratic function approximation, to thereby adopt a quadratic approximated curve with the smallest quadratic coefficient "a" in the obtained quadratic approximated curves as the approximated curve for calculating the in-focus height of the pad 3. In the example of FIG. 5, the quadratic coefficients "a" of the approximated curves A, B and C are 0.1806, −1.0885 and 0.046, so that the approximated curve B having the smallest value for the quadratic coefficient "a" (a=−1.0885) is selected as the quadratic approximated curve for calculating the in-focus height.

In order to obtain a peak point position from the approximated curve selected as above, by utilizing the fact that the approximated curve with the peak position is always an upwardly-convex quadratic curve, the peak point position may be defined as a position where an inclination on the upwardly-convex quadratic curve B (so-called first derivation) is zero, i.e., a position of $x=-b/2a$. In the case of the example of FIG. 5, since $y=-1.0885x^2+0.5114x+249.89$, $x=-b/2a\approx0.235$, and the in-focus height of the pad 3 from the reference plane can be obtained as 0.235 μm.

When the in-focus height of the pad 3 is obtained as described above, it is checked whether the obtained in-focus height can be accepted as truly correct or not. Since the quadratic curve with the peak value is an upwardly-convex quadratic curve, the quadratic coefficient "a" of the approximated curve $y=ax^2+bx+c$ is a negative value, which does not become a positive value. In addition, the in-focus height of the pad 3 has an acceptable range in design, and the obtained in-focus height must be within the acceptable range.

If the obtained in-focus height is accepted as correct, a series of processes is terminated. On the other hand, if the obtained in-focus height is not accepted as correct, the measurement range of the in-focus height is set again, and the measurement processing for the in-focus height of the pad 3 is repeated. In this way, the in-focus height of the pad 3 can be automatically obtained by image processing.

When the in-focus height of the pad 3 is measured, there are the following reasons for setting the luminance detection windows W1 to W8 so as to cross the edge 3a of the pad 3 and for utilizing the luminance differences between adjacent pixels within the luminance detection window.

In general, near the edge 3a of the pad 3, the luminance drastically changes between both sides of the edge 3a, and a degree of change in luminance greatly depends on whether the taken image is in focus or not. When the taken image is in focus, the taken image becomes clear, and thus the luminance difference between both sides of the edge 3a is increased. When the taken image is not in focus, the taken image is blurred, and thus the luminance difference between both sides of the edge 3a is decreased.

Therefore, by obtaining differences in luminance values between the adjacent pixels in the luminance detection window which is set to cross the edge 3a, how correct the focus of the taken image is or whether the taken image is in focus or not can be objectively known from the magnitude of the difference.

Accordingly, for each image successively taken at predetermined step intervals (for example, intervals of 1 μm) in the vertical direction, by calculating and comparing the luminance levels of the pad 3, an objective and accurate determination can be made as to which taken image is in focus based on the magnitude of the luminance level.

(2) Detection Processing of In-Focus Height of Upper Surface of Bonded Ball (Steps S4 to S6 in FIG. 3)

Next, the processing for obtaining the in-focus height of the upper surface 9 of the bonded ball 5, i.e., the height position of the upper surface 9 of the bonded ball 5 in the Z-axis direction or vertical direction will be described with reference to a taken image of FIG. 6.

When the processing is started, under the control of the control unit 18, the XYZ position control section 15 drives and controls the XYZ-axis drive mechanism 14 to move the camera 12 to a maximum-height position (or a minimum-height position) of a measurement range of the in-focus height of the upper surface 9 of the bonded ball 5 which is set in advance (step S4 of FIG. 3).

At the same time, the control unit 18 drives and controls the light-emitting diodes in the coaxial-illumination RGB light source 19 to generate yellow light (or red light) and transmit the yellow light (or red light) to the coaxial illumination means 20 via the optical fiber 23, to thereby illuminate the bonding portion between the ball 5 and pad 3 with the yellow light (or red light) (step S5 of FIG. 3).

In obtaining the in-focus height of the upper surface 9 of the bonded ball 5, the yellow light or red light is used as the illumination light for the following reason. The in-focus height of the upper surface 9 of the bonded ball 5 is obtained by detecting concave and convex patterns or irregularity patterns on the surface of the upper surface 9 of the bonded ball 5. In general, the more correctly the camera 12 focuses on the upper surface 9 of the bonded ball 5, the more clearly the irregularity patterns are observed. Therefore, the irregularity patterns on the upper surface 9 of the bonded ball 5 are readily detected when contrast is enhanced in the image by increasing the luminance level of the upper surface 9 of the bonded ball 5 as much as possible. Therefore, the yellow light or red light is adopted as the illumination light, which enhances contrast in the image to render the irregularity patterns on the surface more noticeable.

Figure 6:
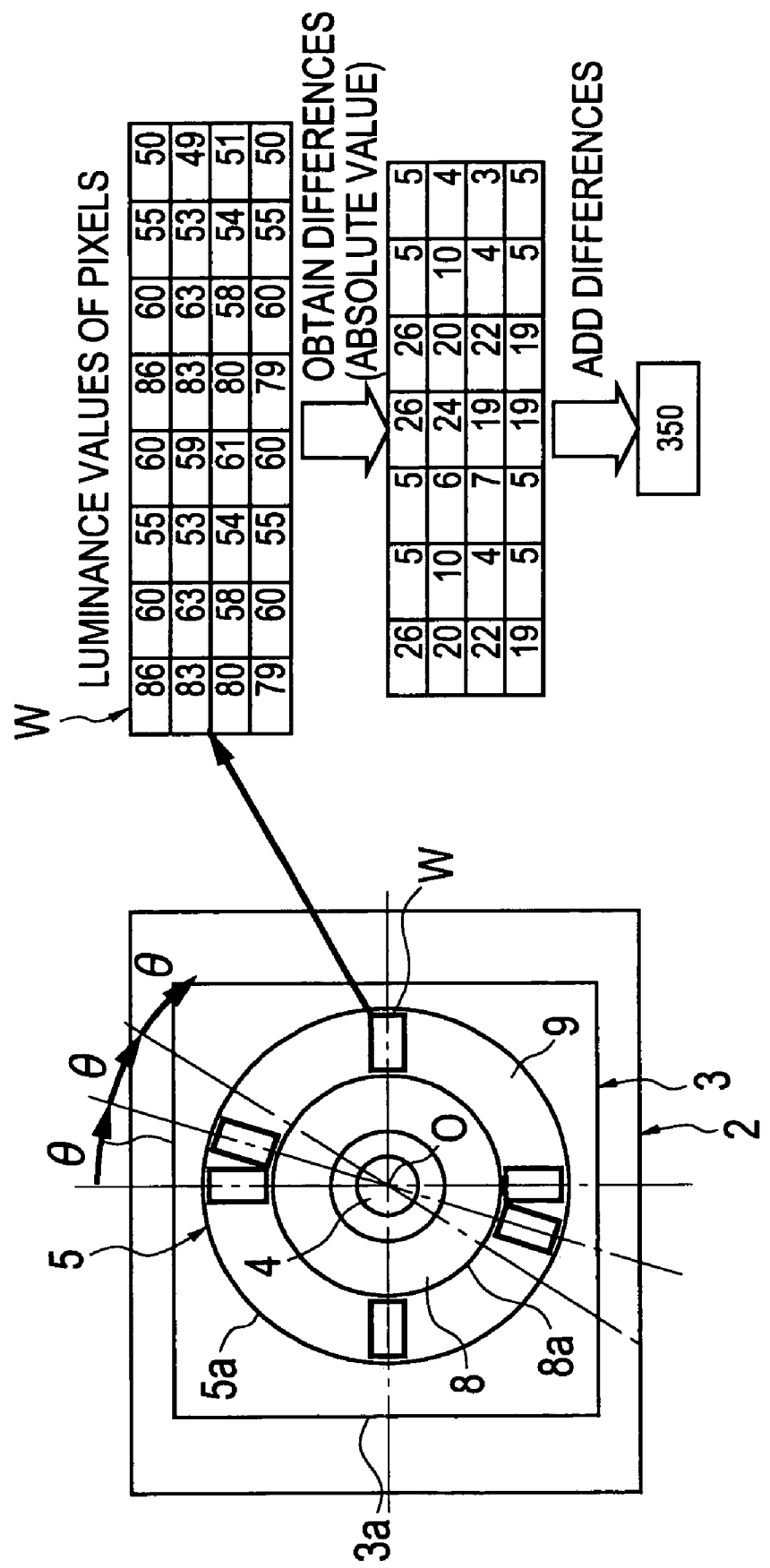
FIG. 6 is an explanatory view showing detection processing of an in-focus height of an upper surface of the bonded ball.

The camera 12 takes a plane image of the bonding portion between the pad 3 and the ball 5 illuminated by the yellow coaxial light (or red coaxial light) and transmits it to the image processing section 16 as a luminance image shown in FIG. 6. The image processing section 16 executes image processing described below, based on the luminance image taken with the yellow coaxial light (or red coaxial light), to detect the in-focus height of the upper surface 9 of the bonded ball 5, i.e., the position of the upper surface 9 of the bonded ball 5 in the Z-axis direction or vertical direction (step S6 of FIG. 3). The calculation of the luminance level of the upper surface 9 of the bonded ball 5 is performed in a manner shown in FIG. 6.

First, a luminance detection window W having a predetermined size is set to be located on the upper surface 9 of the bonded ball 5 along a radial direction of the ball 5 in the taken image captured.

In the case of the example shown in FIG. 6, the luminance detection window is constituted by an array of pixels in four rows and eight columns, which window has a four-pixel width in a direction orthogonal to the radial direction of the ball 5 and an eight-pixel width in a direction parallel to the radial direction of the ball 5 (a total of 32 pixels), as illustrated as the luminance detection window W in the top-right section of FIG. 6.

While the luminance detection window W is successively rotated by a predetermined rotation step angle θ, at each rotation step position, a difference luminance value between the adjacent pixels in each row is calculated in the luminance detection window W. Then, the difference luminance values in the luminance detection window are added, and the added value of the obtained difference luminance values is defined as a difference luminance value of the upper surface 9 of the bonded ball 5 at the rotation step position.

The difference luminance value of the upper surface 9 of the bonded ball 5 is obtained for each rotation step position, followed by adding the difference luminance value of the upper surface 9 of the bonded ball 5 thus obtained for each rotation step position, so that the added value of the obtained difference luminance values is defined as a luminance level of the upper surface 9 of the bonded ball 5 in the taken image.

To facilitate understanding, the processing will be specifically described with reference to FIG. 6.

For the luminance detection window W, when assuming that luminance values of respective pixels have values shown in a table in the top-right section of FIG. 6 at the rotation step position situated on the right side of the horizontal center line shown in FIG. 6, difference operations are performed between the adjacent pixels along the radial direction of the ball 5 or in each row to obtain the difference luminance values (absolute values).

Subsequently, the 28 obtained difference luminance values are added, and the added value of 350 is defined as the difference luminance value of the upper surface 9 of the bonded ball 5 at the rotation step position shown in FIG. 6.

After the difference luminance value of the upper surface 9 of the bonded ball 5 is obtained for each rotation step position in the same manner as described above, the obtained difference luminance values of the upper surface 9 of the bonded ball 5 for respective rotation step positions are added, so that the added difference luminance value is defined as the luminance level of the upper surface 9 of the bonded ball 5 in the taken image.

When the luminance level of the upper surface 9 of the bonded ball 5 is obtained for one (1) taken image as described above, the camera 12 is moved to a next measurement position at the predetermined step intervals (for example, intervals of 1 μm) and the calculation processing of the luminance level of the upper surface 9 of the bonded ball 5 at the position is repeated.

When the measurement of the luminance level of the upper surface 9 of the bonded ball 5 has been completed for the taken image at every step position within the measurement range, the in-focus height of the upper surface 9 of the bonded ball 5 in the semiconductor chip 2 is determined.

The in-focus height of the upper surface 9 of the bonded ball 5 can be determined in such a manner that a taken image with the highest calculated luminance level of the upper surface 9 of the bonded ball 5 is selected from all the taken images taken at predetermined step intervals and the image taking height position of the selected taken image is defined as a position at which the camera 2 is best focused on the upper surface 9 of the ball 5, i.e., the in-focus height of the upper surface 9 of the bonded ball 5.

However, for the in-focus height of the upper surface 9 of the bonded ball 5, since respective taken images also are successively taken at the predetermined step intervals (for example, intervals of 1 μm), the exact in-focus height of the upper surface 9 of the bonded ball 5 may exist in an intermediate position between the steps, at which intermediate position an image is not taken actually by the camera 12.

Therefore, in determining the in-focus height of the upper surface 9 of the bonded ball 5, although the taken height position at which the taken image has the highest luminance level may be adopted as the in-focus height of the upper surface 9 of the bonded ball 5 without modification, as is the case for determining the in-focus height of the pad 3 described above, it is desirable to calculate a peak position of the in-focus height by a quadratic function approximation using the luminance level data of the upper surface 9 of the bonded ball 5 in each taken image and to adopt the peak position as the in-focus height of the upper surface 9 of the bonded ball 5.

In this way, the in-focus height of the upper surface 9 of the bonded ball 5 can be automatically obtained by image processing based on the taken images taken by the camera 12.

When the in-focus height of the upper surface 9 of the bonded ball 5 is measured, there are the following reasons for setting the luminance detection window W at the inside of the upper surface 9 of the bonded ball 5 rather than at the outer peripheral edge (or external diameter line 5*a*) of the bonded ball 5.

If the luminance detection window W is set to cross the outer peripheral edge or external diameter line 5*a* of the ball 5 as is the case with the measurement of the in-focus height of the pad 3 described above, the obtained height will have the maximum luminance difference between the edge portion of the ball 5 and the pad 3. If such detection is performed, since the edge portion of the ball 5 has a circular-arc curved surface as is apparent from FIG. 2A, the in-focus height of the upper surface 9 of the bonded ball 5 is likely to be obtained as a height lower than the height of the flat portion of the upper surface 9 of the bonded ball 5 which is actually attempted to be obtained. In addition, due to differences in the shape of the curved surface at the edge portion of the ball 5, variations may be generated in the detected heights. In fact, when the measurement was performed by setting the luminance detection window W at the edge portion of the ball 5, it was found that the value was about 2 μm lower than the height of the flat portion of the upper surface 9 of the bonded ball 5.

Therefore, the luminance detection window W is set at the inside of the upper surface 9 of the bonded ball 5, and the in-focus height of the upper surface 9 of the bonded ball 5 is obtained from the luminance differences between the adjacent pixels in the luminance detection window W. In general, the more correctly the upper surface 9 of the bonded ball 5 is focused, the more clearly fine texture patterns are visible on the upper surface 9 of the bonded ball 5, so that the luminance difference between the adjacent pixels becomes greater in the luminance detection window W. Accordingly, by obtaining and adding the luminance differences between the adjacent pixels and comparing the added values, the image taking height position at which the taken image has the largest value can be defined as the best focused position, i.e., the in-focus position of the upper surface 9 of the bonded ball 5.

(3) Calculation of Thickness t of Bonded Ball (Step S7 in FIG. 3)

After the in-focus height of the pad 3 and the in-focus height of the upper surface 9 of the bonded ball 5 are obtained as described above, a difference operation (subtraction) is performed between the obtained in-focus height of the pad 3 and the in-focus height of the upper surface 9 of the bonded ball 5. Thus, the thickness t of the bonded ball 5 can be automatically measured through the image processing.

(4) Detection Processing of External Diameter of Bonded Ball (Steps S8 to S10 in FIG. 3)

Now, detection processing of an external diameter D of the bonded ball 5 will be described with reference to a taken image of FIG. 7.

When the processing is started, under the control of the control unit 18, the XYZ position control section 15 drives and controls the XYZ-axis drive mechanism 14 to move the camera 12 to a detection position of the external diameter D ball of the bonded ball, which position is set in advance (step S8 of FIG. 3).

At the same time, the control unit 18 drives and controls the light-emitting diodes in the coaxial-illumination RGB light source 19 to generate blue light and transmit the blue light to the coaxial illumination means 20 via the optical fiber 23, to thereby illuminate the bonding portion between the ball 5 and pad 3 with the blue coaxial light (step S9 of FIG. 3).

In obtaining the external diameter D of the bonded ball 5, the blue light is used as the illumination light for the following reason. The external diameter D of the bonded ball 5 is obtained by detecting an edge portion of the upper surface 9 of the bonded ball 5 which forms a boundary between the bonded ball 5 and the pad 3 in the taken image. The blue light is adopted for clarifying the difference between the luminance levels of the upper surface 9 of the bonded ball 5 and the pad 3. In the case of red light or yellow light, since the luminance is increased both in the upper surface 9 of the bonded ball 5 and the pad 3, there is not a significant contrast between the upper surface 9 of the bonded ball 5 and the pad 3, making the detection of the edge of the bonded ball 5 difficult.

Figure 7:
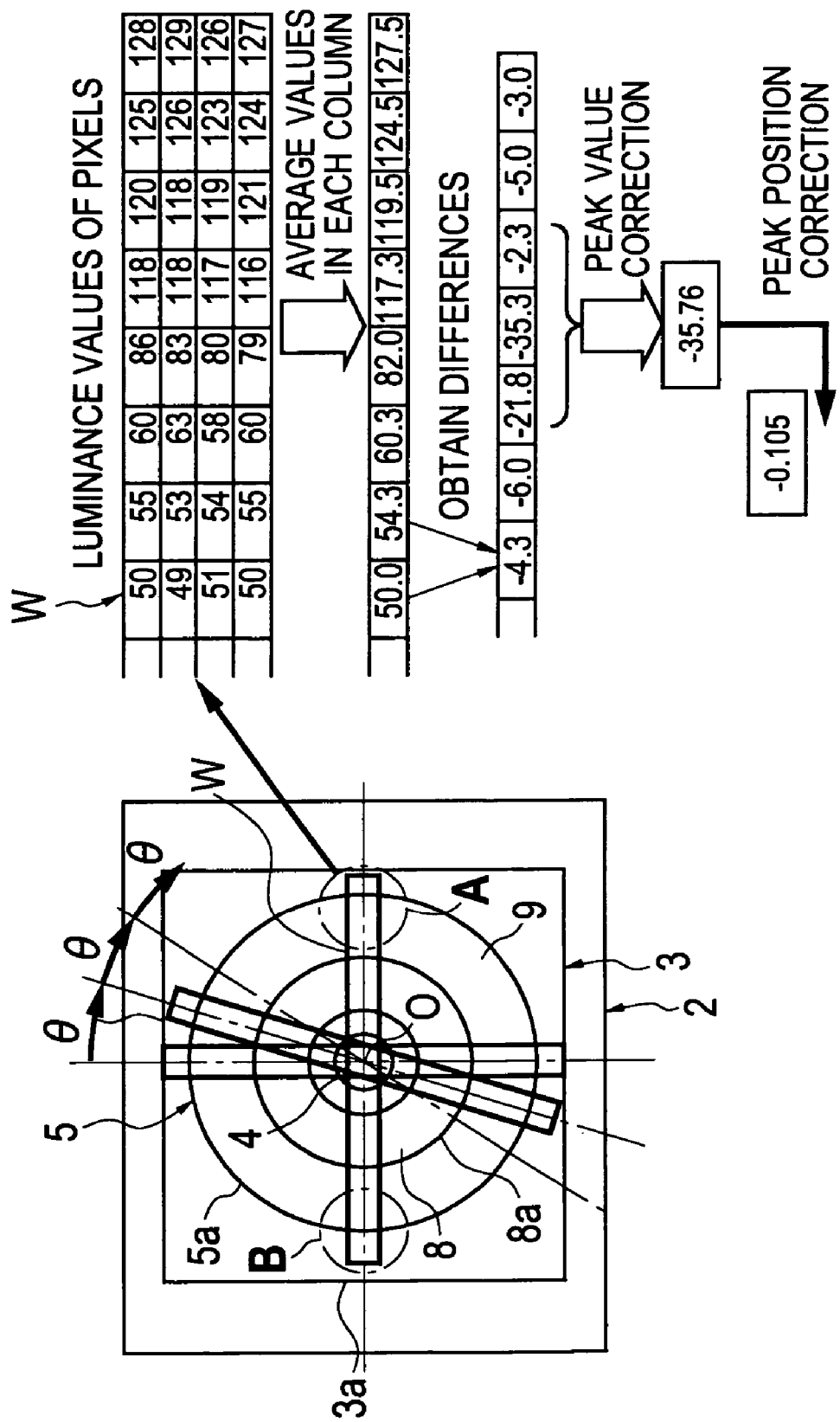
FIG. 7 is an explanatory view showing detection processing of an external diameter of the bonded ball.

The camera 12 takes a plane image of the bonding portion between the pad 3 and the ball 5 illuminated by the blue coaxial light and transmits it to the image processing section 16 as a luminance image shown in FIG. 7. The image processing section 16 executes image processing described below, based on the luminance image taken with the blue coaxial light, to detect the external diameter D of the bonded ball 5 (step S10 of FIG. 3). The calculation of the external diameter D of the bonded ball 5 is performed in a manner shown in FIG. 7.

First, a luminance detection window W with an appropriate length and width is set along the radial direction of the ball 5 so that the luminance detection window W crosses diametrically opposite ends of the external diameter line (or outer peripheral edge) 5a of the ball 5 on the taken image captured by the image processing section 16.

While the luminance detection window W is successively rotated by a predetermined rotation step angle θ: luminance values of all pixels within the luminance detection window W are captured at each rotation step position; the luminance values thus captured are added and averaged in each column or in a direction orthogonal to a radial direction of the ball 5 to obtain average luminance values; and then differences between the adjacent average luminance values are obtained. By way of example, in tables of FIG. 7, the luminance values, average values and difference values are shown for pixels in an edge portion A of the luminance detection window W situated on the right side of the horizontal center line shown in FIG. 7.

Subsequently, from the obtained difference values, for the right side edge portion A of the luminance detection window W, pixels in two adjacent columns are selected, which pixels give a first difference peak value as counted from the right side edge of the window W (in FIG. 7, pixels giving a difference value of −35.3). Similarly, for the left side edge portion B of the luminance detection window W, pixels in two adjacent columns are selected, which pixels give a first difference peak value as counted from the left side edge of the window W (not shown). The two sets of pixels giving the pair of peak values on the right and left sides indicate positions of the right and left side edges of the external diameter line 5a of the ball 5, respectively.

Therefore, by calculating the distance between the selected two sets of pixels giving the pair of peak values on the right and left sides, the diameter of the external diameter line 5a of the ball 5, i.e., the external diameter D of the ball 5, can be determined. The distance between the two sets of pixels giving the peak values can be easily calculated from position coordinates (or X, Y coordinates) of each pixel.

In an actual measurement, as mentioned with regard to the detection processing of the in-focus height of the pad 3 shown in FIG. 4, the external diameter line 5a of the ball 5 may lie or run on the middle of the pixel rather than through the boundary between the pixels. In this case, the luminance value of the pixel overlapping with the external diameter line 5a may be smaller than the real value, and the resultant difference value may also be smaller than the real value.

Therefore, although the coordinate position corresponding to the maximum difference luminance value of −35.3 obtained as above may be adopted as the coordinate position of the external diameter line 5a without modification, it is preferable, as is the case with FIG. 4, that a peak value correction be performed by a quadratic function approximation using the difference luminance values of −21.8 and −2.3 on both sides thereof, and the coordinate position giving the corrected peak value be adopted as the real coordinate position of the external diameter line 5a.

For reference, in FIG. 7, a value of −35.76 is shown as a peak value after the peak value correction by the quadratic function approximation using the difference luminance values of −21.8 and −2.3 on both sides of −35.3, and a value of −0.105 is also shown as a correction value for the peak value position, which gives the position of the corrected peak value of −35.76. The real position of the external diameter line 5a is shifted to the left side or minus (−) side by 0.015 from the position of the pixels giving the maximum difference luminance value of −35.3. The correction is performed for the left side edge portion B of the luminance detection window W in the same way, and the external diameter D of the ball 5 may be calculated from the position coordinates of the two corrected peak positions.

After the external diameter D of the ball 5 is obtained for each rotation step position as described above, an average value of all the obtained external diameters D of the ball 5 is calculated, so that the average value may be defined as the external diameter D of the ball 5. Thus, the external diameter D of the ball 5 can be automatically measured through image processing.

(5) Detection Processing of Ball Bonded Point (Steps S11 to S13 in FIG. 3)

Now, detection processing of a bonded point O of the ball 5, i.e. a center position of the ball 5, will be described with reference to a taken image of FIG. 8.

When the processing is started, under the control of the control unit 18, the XYZ position control section 15 drives and controls the XYZ-axis drive mechanism 14 to move the camera 12 to a detection position which is set in advance (step S11 of FIG. 3).

At the same time, the control unit 18 drives and controls the light-emitting diodes in the coaxial-illumination RGB light source 19 to generate red light (or yellow light) and transmit the red light (or yellow light) to the coaxial illumination means 20 via the optical fiber 23, to thereby illuminate the bonding portion between the ball 5 and pad 3 with the red coaxial light (or yellow coaxial light) (step S12 of FIG. 3).

In obtaining the bonded point O of the ball 5, the red light or yellow light is used as the illumination light for the following reason. In the case of the example shown in FIG. 8, the detection of the bonded point O of the ball 5 is performed by detecting an external diameter line 8a of the cone portion 8 in the taken image shown in FIG. 8. Therefore, in order to detect the external diameter line 8a, it is desirable that a larger luminance difference exists between the cone portion 8 and the upper surface 9 of the bonded ball 5. Accordingly, the red light or yellow light is adopted, which increases the luminance difference. In the case of blue light, the luminance difference between the cone portion 8 and the upper surface 9 of the bonded ball 5 is small, making the detection of the external diameter line 8a of the cone portion difficult.

Figure 8:
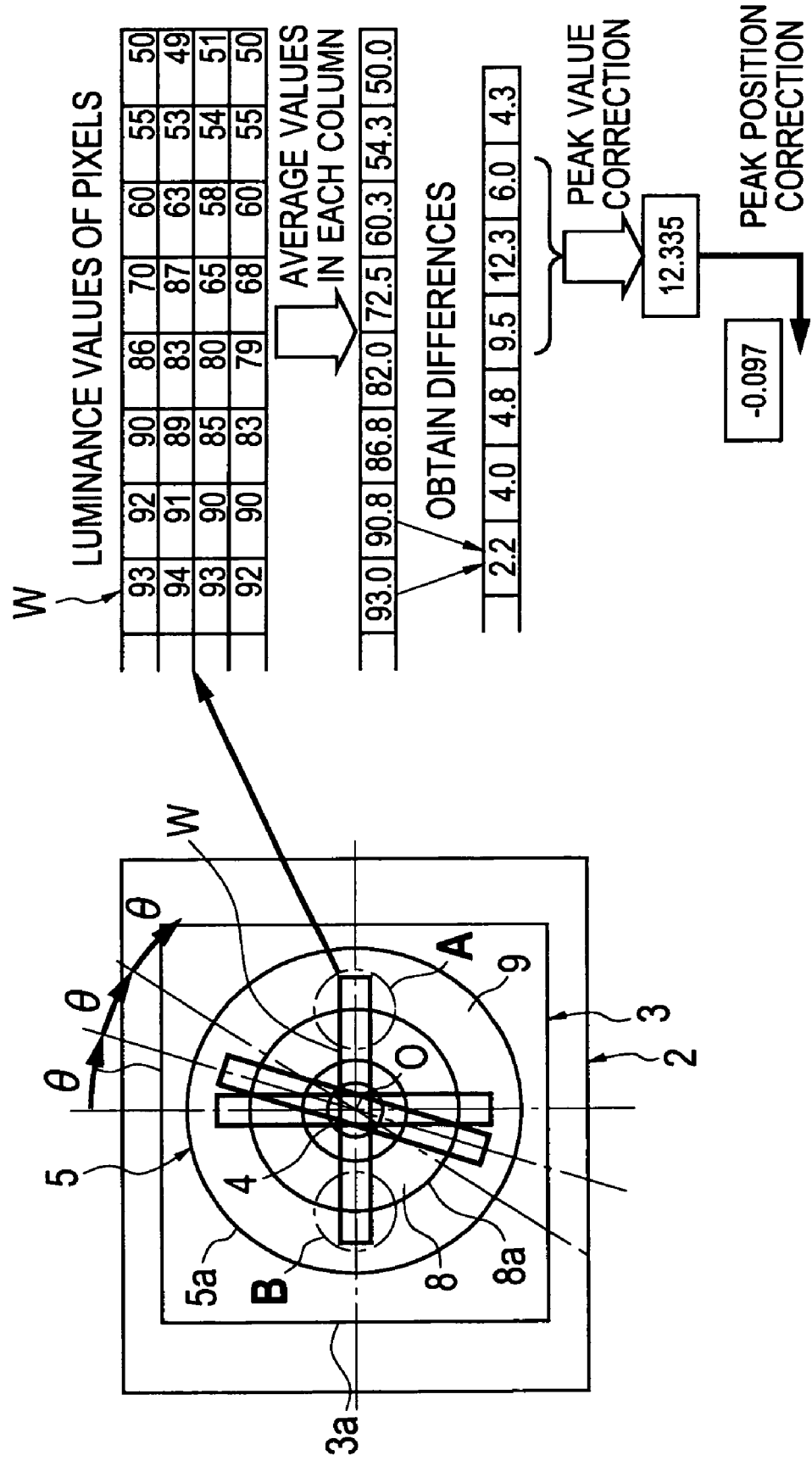
FIG. 8 is an explanatory view showing detection processing of a ball bonded point.

The camera 12 takes a plane image of the bonding portion between the pad 3 and the ball 5 illuminated by the red coaxial light (or yellow coaxial light) and transmits it to the image processing section 16 as a luminance image shown in FIG. 8. The image processing section 16 executes image processing described below, based on the luminance image taken with the red coaxial light (or yellow coaxial light), to detect the bonded point O of the ball 5 (step S13 of FIG. 3). The detection of the bonded point O of the ball 5 is performed in a manner shown in FIG. 8.

First, a luminance detection window W with an appropriate length and width is set along the radial direction of the ball 5 so that the luminance detection window W crosses diametrically opposite ends of the external diameter line 8a of the cone portion 8 on the taken image captured by the image processing section 16.

While the luminance detection window W is successively rotated by a predetermined rotation step angle θ: luminance values of all pixels within the luminance detection window W are captured at each rotation step position; the luminance values are added and averaged in each column or in the direction orthogonal to the radial direction of the ball 5 to obtain average luminance values; and then, differences between adjacent average luminance values are obtained. By way of example, in the tables of FIG. 8, the luminance values, average values and difference values are shown for pixels in an edge portion A of the luminance detection window W situated on the right side of the horizontal center line shown in FIG. 8.

Subsequently, from the obtained difference values, for the right side edge portion A of the luminance detection window W, pixels in two adjacent columns are selected, which pixels give a first difference peak value as counted from the right side edge of the luminance detection window W (in FIG. 8, pixels giving a difference value of 12.3). Similarly, for the left side edge portion B of the luminance detection window W, pixels in two adjacent columns are selected, which pixels give a first difference peak value as counted from the left side edge of the window W (not shown). The two sets of pixels giving the pair of peak values on the right and left sides indicate positions of right and left side edges of the external diameter line 8a of the cone portion 8, respectively.

Therefore, by obtaining the middle point between the thus selected two sets of pixels giving the pair of peak values on the right and left sides, the bonded point O of the ball 5 can be determined. The middle point between the two sets of pixels giving the peak values can be easily calculated from position coordinates (or X, Y coordinates) of each pixel.

In an actual measurement, as is the case with FIG. 7 described above, the external diameter line 8a of the cone portion 8 may lie or run on the middle of the pixel rather than through the boundary between the pixels. In this case, the luminance value of the pixel overlapping with the external diameter line 8a may be smaller than the real value, and the difference value may also be smaller than the real value.

Therefore, although the coordinate position corresponding to the maximum difference luminance value of 12.3 obtained as above may be adopted as the coordinate position of the external diameter line 8a without modification, it is preferable, as is the case with FIG. 7, that a peak value correction be performed by a quadratic function approximation using the difference luminance values on both sides thereof (in the example of FIG. 8, of 9.5 and 6.0), and the coordinate position giving the corrected peak value be adopted as the real coordinate position of the external diameter line 8a.

For reference, in FIG. 8, a value of 12.335 is shown as a peak value after the peak value correction by the quadratic function approximation using the difference luminance values of 9.5 and 6.0 on both sides of 12.3, and a value of −0.097 is also shown as a correction value for the peak value position, which gives the position of the corrected peak value of 12.335. The real position of the external diameter line 8a is shifted to the left side or minus (−) side by 0.097 from the position of the pixels giving the maximum difference luminance value of 12.3. The correction is performed for the left side edge portion B of the luminance detection window W in the same way, and the bonded point O of the ball 5 may be calculated from the position coordinates of the two corrected peak positions.

After the bonded point O of the ball 5 is obtained for each rotation step position as described above, an average position of all the obtained bonded points O is obtained, and the average position may be defined as the bonded point O of the ball 5. As described above, the bonded point O of the ball 5 can be automatically measured through image processing.

Although in the example of FIG. 8, the bonded point O of the ball 5 is obtained by using the external diameter line 8a of the cone portion 8 formed by an inside chamfer portion 7 of the capillary 6, the bonded point O can be obtained by using the external diameter line 5a of the ball 5 instead. The case of using the external diameter line 8a of the cone portion 8 formed by the inside chamfer portion 7 of the capillary 6 is equivalent to obtaining the center point of the capillary 6 at the time of ball bonding, and the case of using the external diameter line 5a of the ball 5 is equivalent to obtaining the center point of the actual bonded ball 5. Either of these two techniques may be adopted as needed. For reference's sake, manufacturers of wire bonding apparatuses often use the external diameter line 8a of the cone portion 8 formed by the inside chamfer portion 7 of the capillary 6 in order to know whether the capillary 6 is moved to positions as designed or not, and manufacturers of semiconductor chips often use the external diameter line 5a of the ball 5 in order to check actual bonding accuracy.

One embodiment of the method of the present invention has been described above, and separate descriptions have been given of the processing of FIG. 4, FIG. 6, FIG. 7 and FIG. 8 in order to facilitate understanding. However, in an actual apparatus, these four types of the processing can be executed by performing necessary processing simultaneously in parallel at each desired step position while vertically moving the camera.

The step intervals for shifting the camera 12 in the vertical direction, the size and the number of the luminance detection windows W, W1 to W8, the rotation step angle θ of the luminance detection window W and the like may be set depending on the processing capacity of the processing section 16 and required measurement accuracy.

The ring illumination constituted by the ring-illumination RGB light source 21 and the ring illumination means 22 is used as auxiliary light for giving optimum contrast to the taken image at the time of processing each measurement with the coaxial illumination, as needed.

Although in the above embodiment, each of the detection processing of the in-focus height of the pad, the detection processing of the in-focus height of the upper surface of the bonded ball, the detection processing of the external diameter of the ball and the detection processing of the ball bonded point is executed in succession, the order of the execution of the processing is mutually interchangeable and each processing is not necessarily executed in a fixed manner.

While the illustrative and presently preferred embodiment of the present invention has been described in detail herein, it is to be understood that the inventive concepts may be otherwise variously embodied and employed and that the appended claims are intended to be construed to include such variations except insofar as limited by the prior art.

What is claimed is:

1. An inspection method of a bonded status of a ball bonded to a pad of a semiconductor chip in wire bonding which attains wiring between the pad of the semiconductor chip and an external electrode, wherein an image of a bonding portion between the pad and the ball is illuminated and images are taken by an image taking means and the images taken by the image taking means are image processed to detect the bonded status of the ball by a control unit for selecting a color of illumination, movement of the image taking means and processing of the taken images, the method comprising:

utilizing coaxial light parallel to an optical axis of a lens of the image taking means as illumination light illuminating the bonding portion between the pad and the ball;

automatically switching the color of the coaxial illumination light between a plurality of different colors depending on details of the inspection of physical characteristics of the bonded status, wherein the details of the inspection of the bonded status include at least detections of each one of an in-focus height of the pad, an in-focus height of an upper surface of the bonded ball, an external diameter of the bonded ball and a ball bonded point; and automatically processing respective images taken at selected colors to determine a height of the pad, a height of an upper surface of the bonded ball, a diameter of the bonded ball and a diameter of the ball bonded point.

2. The inspection method according to claim 1,
wherein the color of the coaxial illumination light is blue at the time of processing the detection of the in-focus height of the pad;
wherein the color of the coaxial illumination light is yellow or red at the time of processing the detection of the in-focus height of the upper surface of the bonded ball;
wherein the color of the coaxial illumination light is blue at the time of processing the detection of the external diameter of the bonded ball; and
wherein the color of the coaxial illumination light is red or yellow at the time of processing the detection of the ball bonded point.

3. The inspection method according to claim 2, wherein the processing of the detection of the in-focus height of the pad includes:

taking a plane image of the bonding portion between the pad and the ball illuminated by the blue coaxial illumination light at each step position while vertically moving the image taking means at predetermined step intervals;

obtaining luminance differences in an edge portion of the pad on each taken image; and determining the in-focus height of the pad based on an image taking height position at which the taken image has the maximum luminance difference.

4. The inspection method according to claim 2, wherein the processing of the detection of the in-focus height of the upper surface of the bonded ball includes:

taking a plane image of the bonding portion between the pad and the ball illuminated by the yellow or red coaxial illumination light at each step position while vertically moving the image taking means at predetermined step intervals;

obtaining luminance differences in the upper surface of the bonded ball on each taken image; and determining the in-focus height of the upper surface of the bonded ball based on an image taking height position at which the taken image has the maximum luminance difference.

5. The inspection method according to claim 2, wherein the processing of the detection of the external diameter of the bonded ball includes:

taking a plane image of the bonding portion between the pad and the ball illuminated by the blue coaxial illumination light with the image taking means;

obtaining luminance differences in an outer peripheral edge portion of the ball on the taken image; and determining the external diameter of the ball based on a distance between positions of pixels of the taken image which are located on the diametrically opposite sides and which have the maximum luminance differences on the respective sides.

6. The inspection method according to claim 2, wherein the processing of the detection of the ball bonded point includes:

taking a plane image of the bonding portion between the pad and the ball illuminated by the red or yellow coaxial illumination light with the image taking means;

obtaining luminance differences in an outer peripheral edge portion of a cone portion formed on the top of the ball on the taken image; and determining the ball bonded point based on a middle point between positions of pixels of the taken image which are located on the diametrically opposite sides and which have the maximum luminance differences on the respective sides.

7. The inspection method according to claim 1, wherein ring illumination light is used as auxiliary light in addition to the coaxial illumination light.

8. The inspection method according to claim 2, wherein ring illumination light is used as auxiliary light in addition to the coaxial illumination light.

9. The inspection method according to claim 3, wherein ring illumination light is used as auxiliary light in addition to the coaxial illumination light.

10. The inspection method according to claim 4, wherein ring illumination light is used as auxiliary light in addition to the coaxial illumination light.

11. The inspection method according to claim 5, wherein ring illumination light is used as auxiliary light in addition to the coaxial illumination light.

12. The inspection method according to claim 6, wherein ring illumination light is used as auxiliary light in addition to the coaxial illumination light.

13. The inspection method according to claim 3 wherein the maximum difference luminous value is determined by a quadratic function approximation method of the luminance difference.

14. The inspection method according to claim 4 wherein the maximum difference luminous value is determined by a quadratic function approximation method of the luminance difference.

15. The inspection method according to claim 5 wherein the maximum difference luminous value is determined by a quadratic function approximation method of the luminance difference.

16. The inspection method according to claim 6 wherein the maximum difference luminous value is determined by a quadratic function approximation method of the luminance difference.

* * * * *